United States Patent
Sano

(10) Patent No.: US 11,930,591 B2
(45) Date of Patent: Mar. 12, 2024

(54) FLEXIBLE SUBSTRATE

(71) Applicant: Japan Display Inc., Tokyo (JP)

(72) Inventor: Takumi Sano, Tokyo (JP)

(73) Assignee: Japan Display Inc., Tokyo (JP)

( * ) Notice: Subject to any disclaimer, the term of this patent is extended or adjusted under 35 U.S.C. 154(b) by 292 days.

(21) Appl. No.: 17/457,059

(22) Filed: Dec. 1, 2021

(65) Prior Publication Data

US 2022/0087010 A1 Mar. 17, 2022

Related U.S. Application Data

(63) Continuation of application No. PCT/JP2020/011784, filed on Mar. 17, 2020.

(30) Foreign Application Priority Data

Jun. 6, 2019 (JP) .................................. 2019-106150

(51) Int. Cl.
*H05K 1/02* (2006.01)
(52) U.S. Cl.
CPC .................................. *H05K 1/028* (2013.01)
(58) Field of Classification Search
CPC ...................................... H05K 1/0277–1/0283
See application file for complete search history.

(56) References Cited

U.S. PATENT DOCUMENTS

| 2015/0282294 A1 | 10/2015 | Wakuda et al. |
| 2015/0282296 A1 | 10/2015 | Ogura et al. |
| 2017/0181276 A1 | 6/2017 | Sawada et al. |

FOREIGN PATENT DOCUMENTS

| JP | 2015-198101 A | 11/2015 |
| JP | 2015-198102 A | 11/2015 |
| JP | 2017-113088 A | 6/2017 |
| JP | 2017-118109 A | 6/2017 |

*Primary Examiner* — Jeremy C Norris
(74) *Attorney, Agent, or Firm* — Maier & Maier, PLLC

(57) ABSTRACT

According to one embodiment, a flexible substrate includes a support plate including a first surface, a line portion located on the first surface and including a first side surface and a second side surface on an opposite side to the first side surface and a protective member which covers the line portion, in contact with the first surface. The line portion includes a flexible insulating base located on the first surface and a wiring layer disposed on the insulating base, the protective member is separated from at least a part of the first side surface via an air layer and from at least a part of the second side surface via an air layer, and the air layers extend along the line portion.

9 Claims, 7 Drawing Sheets

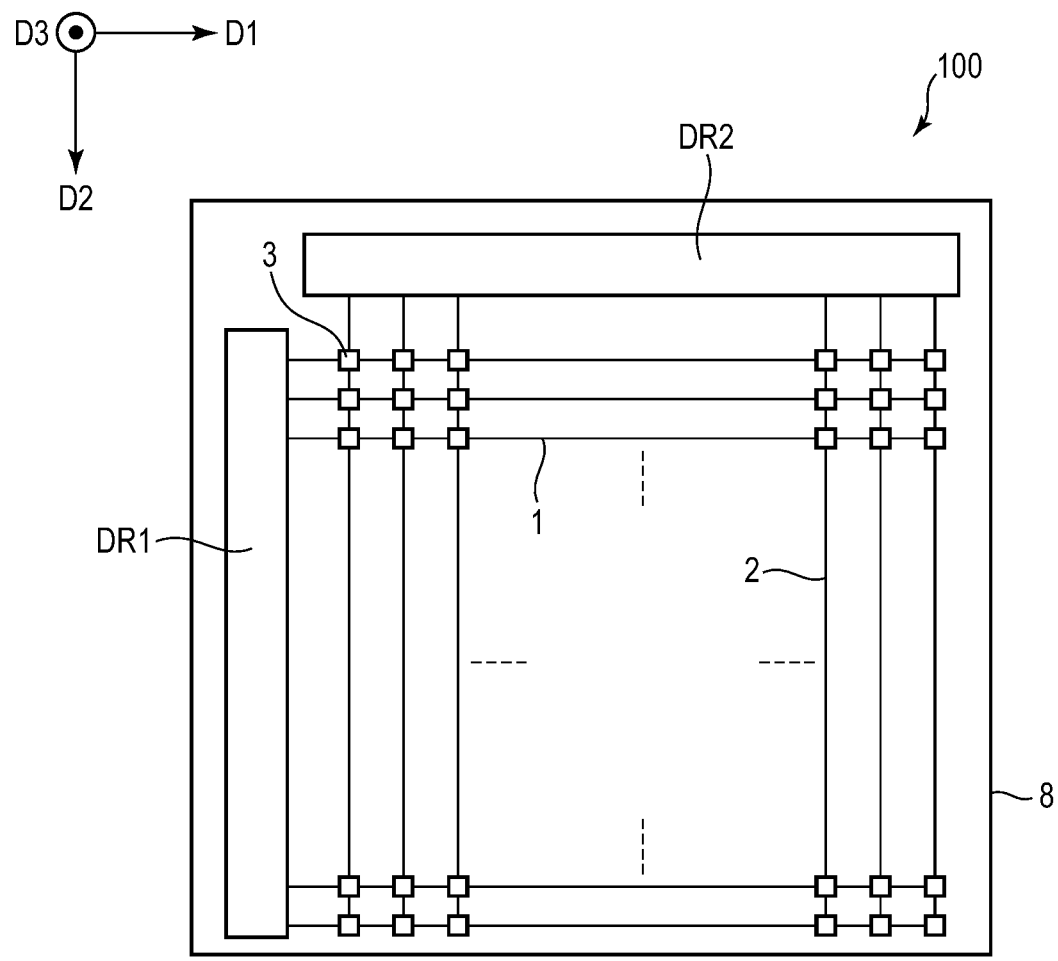
F I G. 1

FLEXIBLE SUBSTRATE

CROSS-REFERENCE TO RELATED APPLICATIONS

This application is a Continuation Application of PCT Application No. PCT/JP2020/011784, filed Mar. 17, 2020 and based upon and claiming the benefit of priority from Japanese Patent Application No. 2019-106150, filed Jun. 6, 2019, the entire contents of all of which are incorporated herein by reference.

FIELD

Embodiments described herein relate generally to a flexible substrate.

BACKGROUND

In recent years, the use of flexible substrates having flexibility and elasticity has been studied in various fields. For example, such a use can be considered that a flexible substrate with electrical elements arranged in a matrix are attached to a curved surface such as an enclosure of an electronic device or a human body. As electrical elements, for example, various types of sensors such as touch sensors and temperature sensors, and display elements, can be applied.

In flexible substrates, it is necessary to take measures to prevent damage to the wiring due to stress caused by bending and stretching. For example, it has been proposed as such measures that honeycomb-shaped openings be provided in the substrate supporting the wiring, and that the wiring be made into a meandering shape.

BRIEF DESCRIPTION OF THE DRAWINGS

FIG. 1 is a plan view schematically showing a flexible substrate according to an embodiment.

DETAILED DESCRIPTION

Figure 2:
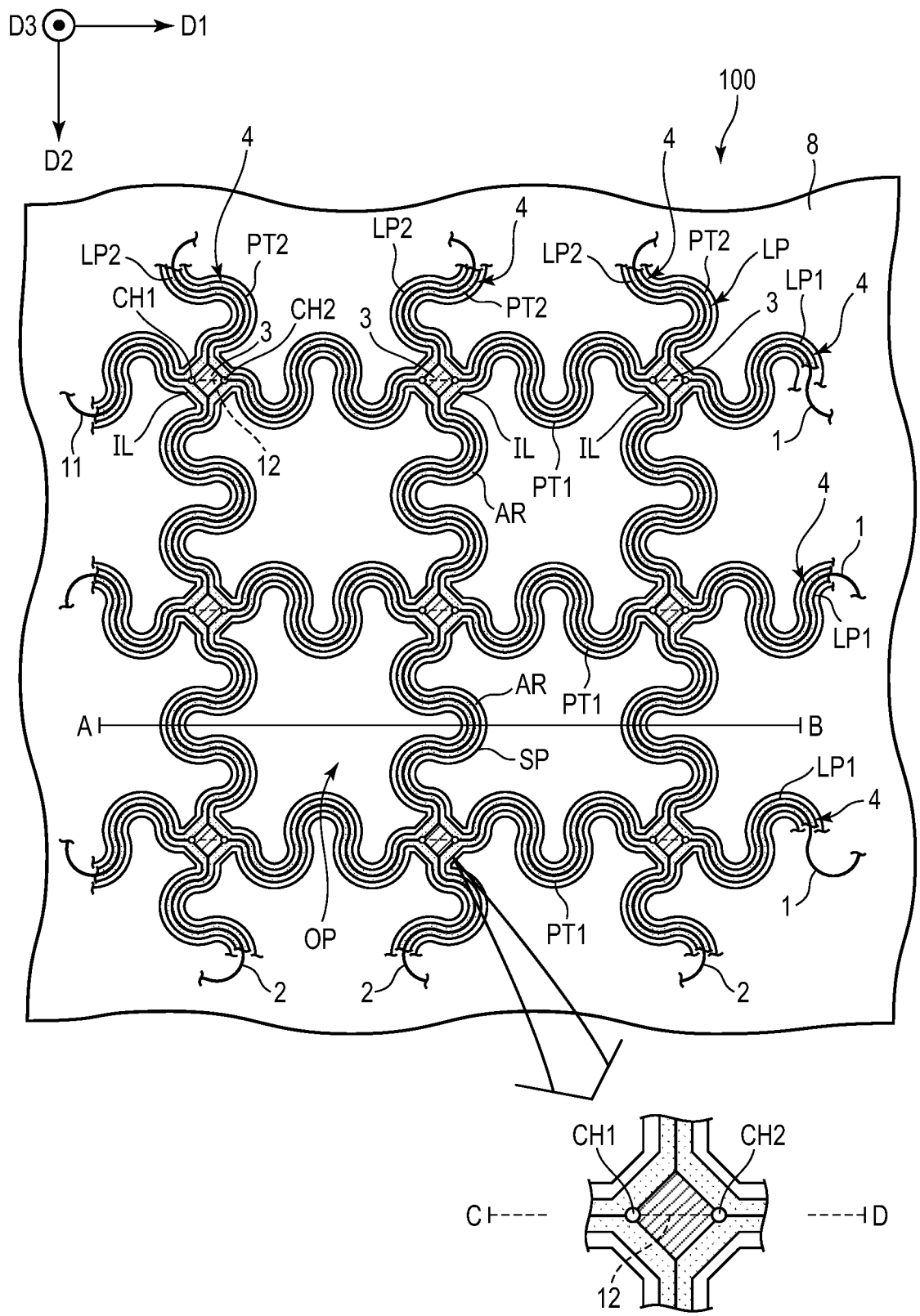
FIG. 2 is a partially enlarged plan view of the flexible substrate shown in FIG. 1.

In general, according to one embodiment, a flexible substrate comprises a support plate including a first surface, a line portion located on the first surface and including a first side surface and a second side surface on an opposite side to the first side surface and a protective member which covers the line portion, in contact with the first surface. The line portion includes a flexible insulating base located on the first surface and a wiring layer disposed on the insulating base, the protective member is separated from at least a part of the first side surface via an air layer and from at least a part of the second side surface via an air layer, and the air layers extend along the line portion.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

FIG. 1 is a plan view schematically showing a flexible substrate 100 according to an embodiment.

In this embodiment, a first direction D1, a second direction D2 and a third direction D3 are defined as shown in the figure. The first direction D1 and the second direction D2 are parallel to the main surface of the flexible substrate 100 and they intersect each other. The third direction D3 is perpendicular to the first direction D1 and the second direction D2, and is equivalent to a thickness direction of the flexible substrate 100. The first direction D1 and the second direction D2 intersect perpendicular to each other in this embodiment, but they may intersect at angles other than perpendicular.

The flexible substrate 100 comprises a plurality of scanning lines 1, a plurality of signal lines 2, a plurality of electrical elements 3, a support plate 8, a scanning line driver DR1 and a signal line driver DR2. The scanning lines 1, the signal lines 2, the electrical elements 3, the scanning line driver DR1 and the signal line driver DR2 are located on the support plate 8. The scanning lines 1 each extend along the first direction D1 and are aligned along the second direction D2. The scanning lines 1 are each connected to the scanning line driver DR1. The signal lines 2 each extend along the second direction D2 and are aligned along the first direction D1. The signal lines 2 are each connected to the signal line driver DR2. The electrical elements 3 are each located at an intersection of a scanning line 1 and a respective signal line 2 and are electrically connected to the scanning line 1 and the signal line 2.

FIG. 2 is a partially enlarged plan view of the flexible substrate 100 shown in FIG. 1.

In addition to the above, the flexible substrate 100 comprises an insulating base 4 and a spacer SP.

The insulating base 4 includes, in planar view, a plurality of first portions PT1 extending along the first direction D1 and aligned along the second direction D2, a plurality of second portions PT2 extending along the second direction D2 and aligned along the first direction D1, and a plurality of island-shaped portions IL provided respectively at intersections of the first portions PT1 and the second portions PT2. The first portion PT1 and the second portion PT2 are each formed in a wavy shape. The island-shaped portions IL are connected to the first portions PT1 and the second portions PT2, respectively. The insulating base 4 has flexibility, and can be formed of polyimide, for example, but it is not limited to this example.

The scanning lines 1 are each located on the respective first portions PT1 and are arranged into a wavy pattern. The signal lines 2 are each located on the respective second portions PT2 and are arranged into a wavy pattern. The scanning lines 1 and the signal lines 2 are examples of the wiring lines of the flexible substrate 100. The scanning lines 1 and the signal lines 2 can be formed, for example, of a metal material or a transparent conductive material, and may be of a single- or a multi-layered structure. The flexible substrate 100 may comprise other types of wiring lines, such as power supply lines that supplies power to the electrical elements 3, in addition to the scanning lines 1 and the signal lines 2.

The scanning lines 1 each include a first portion 11 indicated by a solid line, and a second portion 12 indicated by a dashed line. The second portion 12 overlaps the respective electrical element 3. The first portion 11 and the second portion 12 are located in different layers from each other and are electrically connected to each other via contact holes CH1 and CH2.

The scanning lines 1 supply scanning signals to the electrical elements 3. When, for example, the electrical element 3 is of a type that outputs signals, such as a sensor, the signal line 2 supplies the output signal from the electrical element 3. Further, when, for example, the electrical element 3 is one that operates in response to an input signal, such as a light-emitting element or an actuator, a drive signal is supplied to the signal line 2. The controller, which includes a supply source of scanning signals, a supply source of drive signals, or a processor that processes output signals, may be provided in the flexible substrate 100 or in a device connected to the flexible substrate 100.

The electrical element 3 is located on the respective island-shaped portion IL. The electrical element 3 is smaller than the island-shaped portion IL, and in FIG. 2, the island-shaped portion IL protrudes from an edge of the electrical element 3. For example, the electrical element 3 is a sensor, a semiconductor device or an actuator. For example, as the sensor, an optical sensor that receives visible light or near-infrared light, a temperature sensor, a pressure sensor or a touch sensor can be applied. For example, as the semiconductor element, a light-emitting element, a light-receiving element, a diode or a transistor can be applied. When the electrical element 3 is a light-emitting element, a flexible display having flexibility and elasticity can be realized. As the light-emitting element, for example, a light-emitting diode with a size of around 100 μm, such as a mini-LED or micro-LED, or an organic electroluminescent element can be applied. When the electrical element 3 is an actuator, for example, a piezoelectric element can be applied. Note that the electrical element 3 is not limited to those examples illustrated here, but other elements with various functions can be applied as well. The electrical element 3 may be a capacitor, a resistor or the like. The position and shape of the electrical element 3 are not limited to those of the example shown in FIG. 2.

In this embodiment, the insulating base 4, the scanning lined 1, the signal lined 2, a first organic insulating film 5 and a second organic insulating film 6, which will be described below, will be collectively referred to as line portions LP. The line portions LP are located on the support plate 8. The line portions LP each include a plurality of wavy first line portions LP1 extending along the first direction D1 and aligned along the second direction D2, and a plurality of wavy second line portions LP2 extending along the second direction D2 and aligned along the first direction D1. The first line portions LP1 each include a first portion PT1 of the insulating base 4 described above and the respective scanning line 1. The second line portions LP2 each include a second portion PT2 of the insulating base 4 and the respective signal line 2. The line portions LP form openings OP each surrounded by respective two adjacent first line portions LP1 and respective two adjacent second line portions LP2. The openings OP are arranged in a matrix along the first direction D1 and the second direction D2.

Spacers SP are located respectively in the openings OP. The spacers SP each extend along a first line portion LP1 and a second line portion LP2 in the respective opening OP, and are each formed into a continuous loop shape. In the example illustrated, the first and second line portions LP1 and LP2 have a wavy shape, and therefore the respective spacer SP is arranged in a wavy manner as well. The spacers SP are each located on respective sides of the respective first line portion LP1 so as to interpose the first line portion LP1 therebetween. Similarly, the spacers SP are each located on respective sides of the respective second line portion LP2 so as to interpose the second line portion LP2 therebetween. An air layer AR is interposed between each spacer SP and the respective line portions LP. The air layers AR each extend along the line portions LP. In other words, the air layers AR are each located on respective sides of the first line portions LP1 so as to interpose the first line portions LP1 therebetween, and on respective sides of the second line portions LP2 so as to interpose the second line portions LP2 therebetween.

Figure 3:
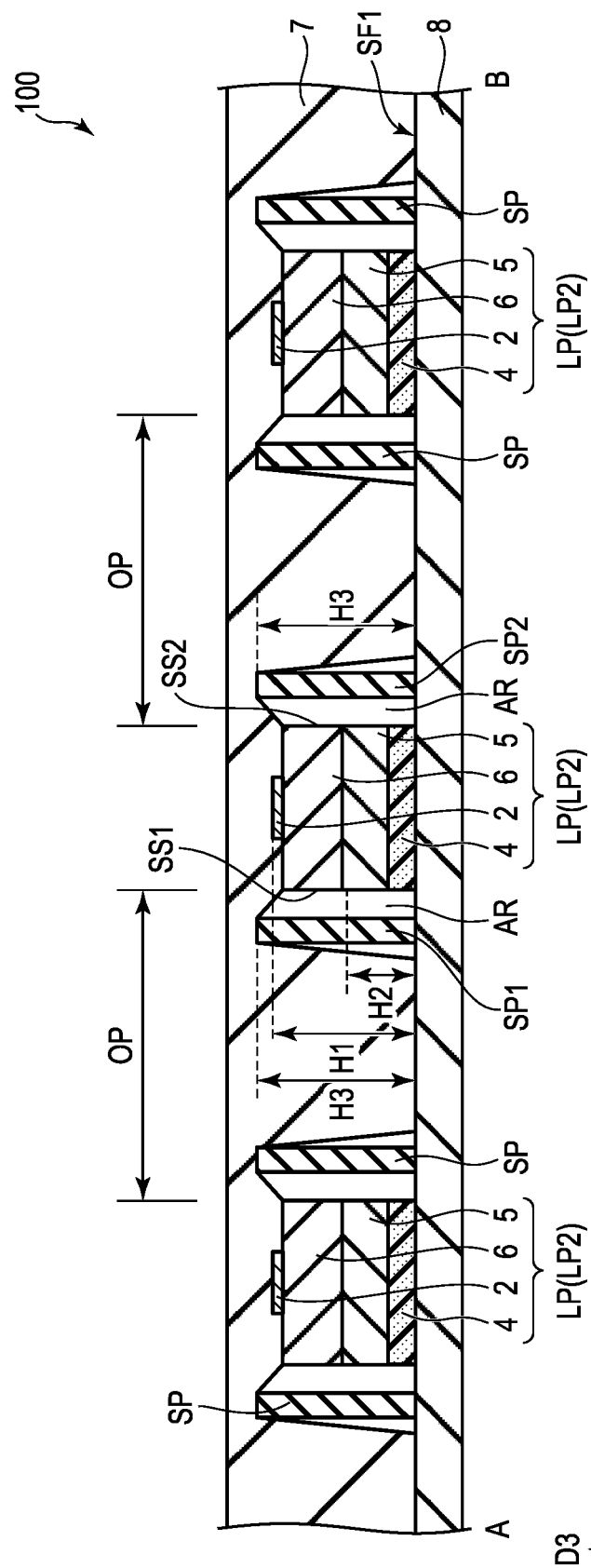
FIG. 3 is a cross-sectional view of the flexible substrate taken along line A-B shown in FIG. 2.

FIG. 3 is a cross-sectional view of the flexible substrate 100 taken along line A-B in FIG. 2.

The flexible substrate 100 further comprises a first organic insulating layer 5, a second organic insulating layer 6 and a protective member 7, in addition to the elements described above.

The support plate 8 comprises a first surface SF1. The line portions LP are located on the first surface SF1. The line portions LP each comprises a first side surface SS1 and a second side surface SS2 on an opposite side to the first side surface SS1. The line portions LP are each constituted by the insulating base 4, the first organic insulating film 5, the second organic insulating film 6, the signal line 2 and the scanning line 1 shown in FIG. 1. Of these, the second line portions LP2 are each constituted by the insulating base 4, the first organic insulating film 5, the second organic insulating film 6, and the signal line 2 as shown in FIG. 3. The first line portions LP1 are constituted by the insulating base 4, the first organic insulating film 5, the second organic insulating film 6 and the scanning line 1, though which are not shown in the figure.

The insulating base 4 is located on the first surface SF1. The first organic insulating film 5 covers the insulating base 4. The second organic insulating film 6 covers the first organic insulating film 5. The signal lines 2 are located on the second organic insulating film 6. The line portions LP has a first height H1 along the third direction D3. The first height H1 is defined as a height between the lower surface of the insulating base 4 and the upper surface of the signal line 2. A half of the first height H1 is defined as a second height H2.

The spacers SP are arranged on the first surface SF1. Here, the configuration will be described by focusing on one line portions LP and spacers SP on both sides. The spacers SP includes a first spacer SP1 opposing the first side surface SS1 and a second spacer SP2 opposing the second side surface SS2. The air layers AR are respectively located between the first spacer SP1 and the first side surface SS1 and between the second spacer SP2 and the second side surface SS2. The first spacer SP1 and the second spacer SP2 have a third height H3. The third height H3 is greater than the first height H1. That is, the first spacer SP1 and the second spacer SP2, which are higher in height than the line portion LP, are located on respective sides of the line portion LP. With this configuration, air layers can be formed between the line portions LP and the respective spacers SP when the protective material 7 is applied over the line portions LP and the spacers SP in the manufacturing process of the flexible substrate 100.

The protective member 7 covers the line portions LP and the spacers SP. In other words, the protective member 7 covers the signal lines 2, the insulating base 4, the first organic insulating layer 5 and the second organic insulating layer 6. Further, the protective member 7 is in contact with the first surface SF1 in the respective opening OP. More specifically, the protective member 7 is in contact with the support plate 8 in an inner circumference of the spacer SP located in the respective opening OP. The protective member 7 is separated from at least a part of the first side surface SS1 via the air layer AR. It is desirable that the first side surface SS1 and the second side surface SS2 be in contact with the respective air layers AR at least between the first surface SF1 and the location of the second height H2. In other words, the air layers AR have a thickness greater than the second height H2. In the example illustrated, the insulating base 4, the first organic insulating film 5 and the second organic insulating film 6 are in contact with the air layers AR.

The first organic insulating layer 5 and the second organic insulating layer 6 are each formed of an organic material. The protective member 7 is formed from a poly-para-xylylene (poly-p-xylylene: PPX) structure, for example, Parylene (registered trademark). The support film 8 may be formed by applying a resin material to the lower surfaces of the insulating base 4 and the protective member 7, or it may be attached thereon via an adhesive layer. The spacers SP are formed of a photosensitive polyimide or the like.

According to this embodiment, the flexible substrate 100 includes the air layers AR respectively between the first side surface SS1 and the protective member 7 and between the second side surface SS2 and the protective member 7. In other words, the protective member 7 is separated from the first side surface SS1 and the second side surface SS2 by the air layers AR. With this configuration, the stress created when the flexible substrate 100 is expanded and propagated from the protective member 7 to the line portions LP can be reduced. Thus, the ductility of the flexible substrate 100 before scanning lines 1 and signal lines 2 may crack, can be improved. Further, the occurrence of cracks in the scanning lines 1 and signal lines 2 can be suppressed.

Figure 4:
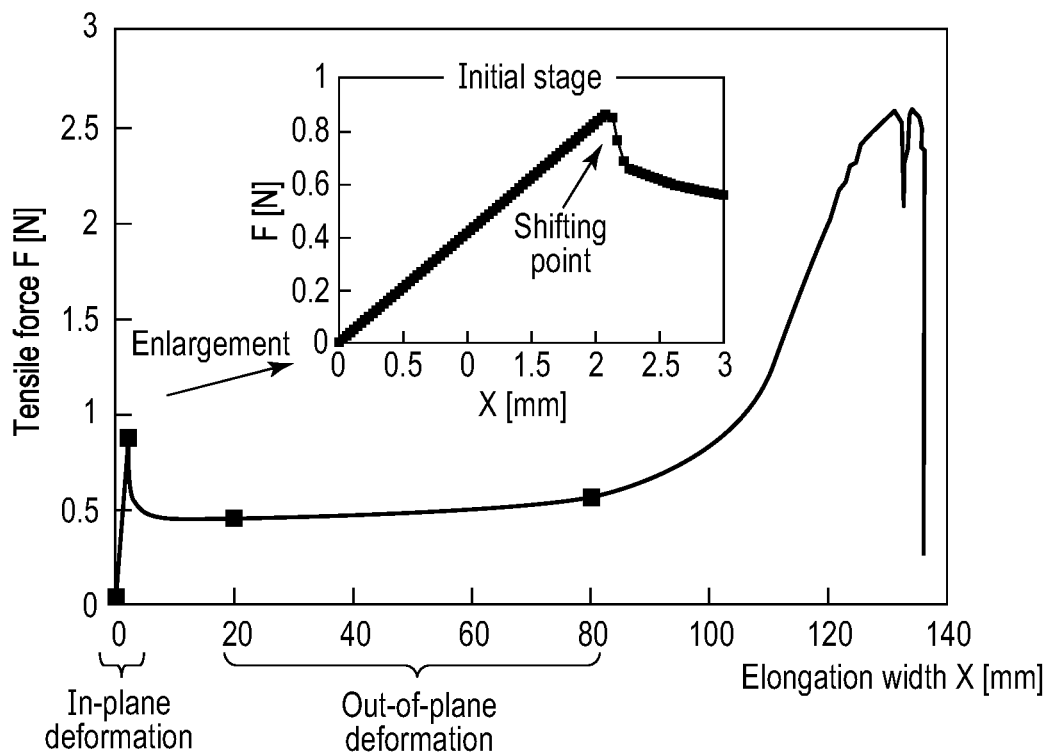
FIG. 4 is a graph showing the characteristics of deformation of the flexible substrate when it is elongated.

FIG. 4 is a graph showing the characteristics of deformation of the flexible substrate 100 when it is elongated.

The vertical axis of the graph indicates the tensile force F [N]. The horizontal axis of the graph shows the elongation width X [mm]. When the flexible substrate 100 is extended, it deforms in the plane in an initial stage. Here, in-plane deformation means deformation in a direction parallel to a D1-D2 plane defined by the first direction D1 and the second direction D2. The flexible substrate 100 switches to out-of-plane deformation from the point when the elongation width reaches a certain level. Here, the out-of-plane deformation corresponds to the case where the substrate is deformed as well in a direction twisted with respect to the D1-D2 plane, i.e., the third direction D3 as well. In the above-described embodiment, the stress on the line portions LP can be relaxed by interposing the air layers AR between the protective member 7 and the line portions LP and the elongation width that can be tolerated to deform out of plane with respect to the tensile force can be increased. Therefore, the elongation rate of the flexible substrate 100 can be increased.

The shape of the openings OP and the arrangement of the scanning lines 1 and the signal lines 2 are not limited to those disclosed in the above embodiment. The openings OP may be polygonal in shape, and the line portions LP may be arranged in a spiral manner. The line portions LP may, for example, be linear or may include a portion that does not overlap any of the scanning lines 1 and the signal lines 2. Thus, the flexible substrate 100 of this embodiment can take various forms.

Figure 5:
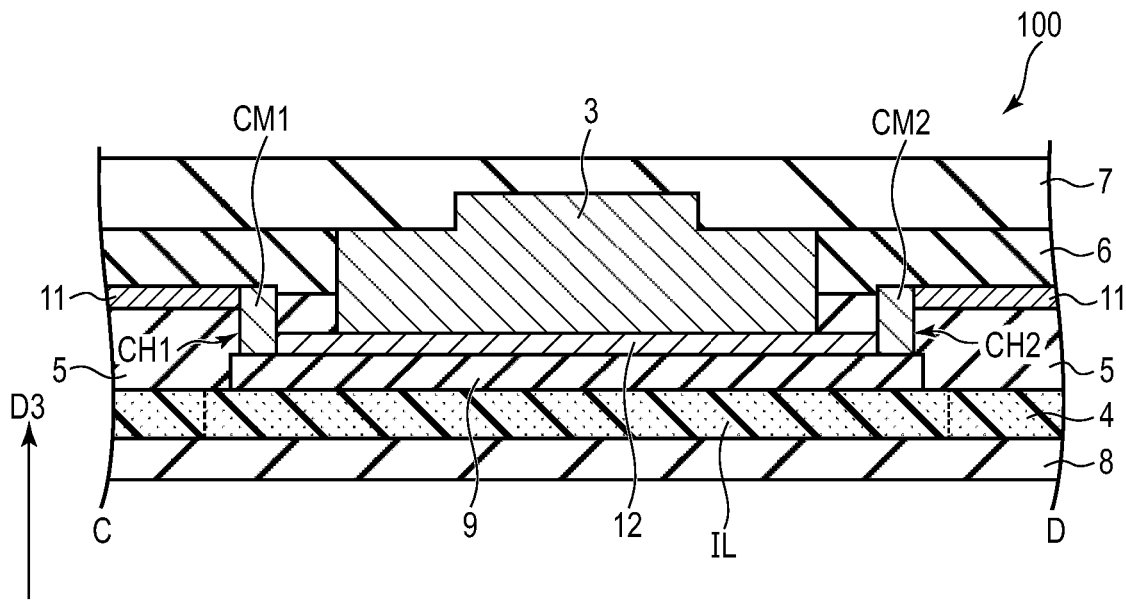
FIG. 5 is a cross-sectional view of the flexible substrate taken along line C-D line shown in FIG. 2.

FIG. 5 is a cross-sectional view of the flexible substrate 100 on line C-D shown in FIG. 2. FIG. 5 shows a cross section including an electrical element 3.

Below the electrical element 3, the island-shaped portion IL of the insulating base 4 is disposed. With this configuration, the electrical element 3 can be well supported. Between the electrical element 3 and the island-shaped portion IL, the inorganic insulating layer 9 (passivation layer) is formed. In planar view, the inorganic insulating layer 9 has an island shaped overlapping the electrical element 3. The first portion 11 of the scanning line 1 is placed on the first organic insulating layer 5 and is covered by the second organic insulating film 6. The second portion 12 of the scanning line 1 is disposed above the inorganic insulating layer 9 (that is, below the first organic insulating layer 5). The second portion 12 is electrically connected to the electrical element 3. In the example of FIG. 5, end portions of the second portion 12 are covered by the first organic insulating layer 5.

The above-described contact holes CH1 and CH2 are provided in the first organic insulating layer 5 in the area they overlap the island-shaped portion IL and the inorganic insulating layer 9 in planar view. The first portion 11 of the scanning line 1 is electrically connected to the second portion 12 via connection members CM1 and CM2 disposed in the contact holes CH1 and CH2, respectively. The connection members CM1 and CM2 may be a part of the first portion 11 or may be separately provided from the first portion 11.

As described above, according to the configuration shown in FIG. 5, the island-shaped inorganic insulating layer 9 is disposed between the electrical element 3 and the insulating base 4. The inorganic insulating layer 9 protects the electrical element 3 and the second portion 12 of the scanning line 1, thus making it possible to increase the reliability of the flexible substrate 100. On the other hand, inorganic films are more susceptible to cracking than organic films, and therefore when wiring lines are formed on the inorganic film, broken lines due to cracking can occur. However, in FIG. 5, there is no inorganic insulating layer 9 below the first portion 11 of the scanning line 1. Therefore, breaking of the scanning line 1 is unlikely to occur. This is also the case for the signal lines, which are not shown in the figure. Further, if the inorganic insulating layer 9 is provided over the entire flexible substrate 100, it may interfere with the elasticity and flexibility of the flexible substrate 100. However, when the inorganic insulating layer 9 is formed into the island shape, such problems will not occur.

Moreover, with the configuration in which the first and second portions 11 and 12 of the scanning line 1, which are arranged in different layers, are connected via the contact holes CH1 and CH2, the degree of freedom in designing in the vicinity of the electrical element 3 can be improved. The contact holes CH1 and CH2 are provided above the inorganic insulating layer 9, and therefore the reliability in the connection position between the first portion 11 and the second portion 12 is also increased.

Figure 6:
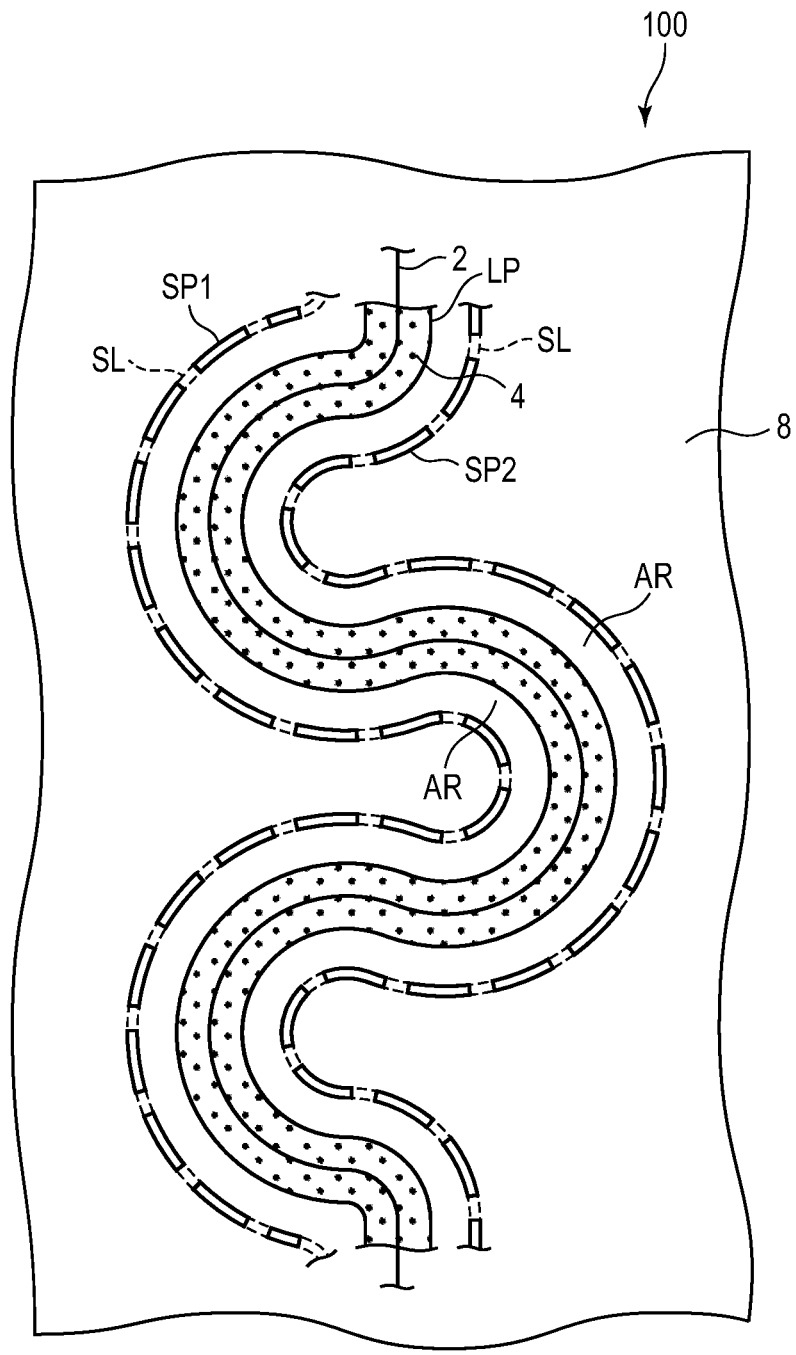
FIG. 6 is a plan view showing an example of the state in which the flexible substrate shown in FIG. 2 is elongated.

FIG. 6 is a plan view showing an example of the state in which the flexible substrate 100 shown in FIG. 2 is expanded. FIG. 6 is a partially enlarged view of the flexible substrate 100 shown in FIG. 2.

The first spacers SP1 and the second spacers SP2 each include a slit SL. The slits SL penetrate to the support plate 8. The slits SL are respectively widened when the flexible substrate 100 is expanded as shown in the figure. The first spacers SP and the second spacers SP can move while following the expansion of the flexible substrate 100 by means of such slits SL. Note that such a configuration will do that when the flexible substrate 100 is started to expand, there are no slits SL created in the first spacers SP1 and the second spacers SP2, and the slits SL are created when the first spacer SP1 and the second spacer SP2 are broken.

Figure 7:
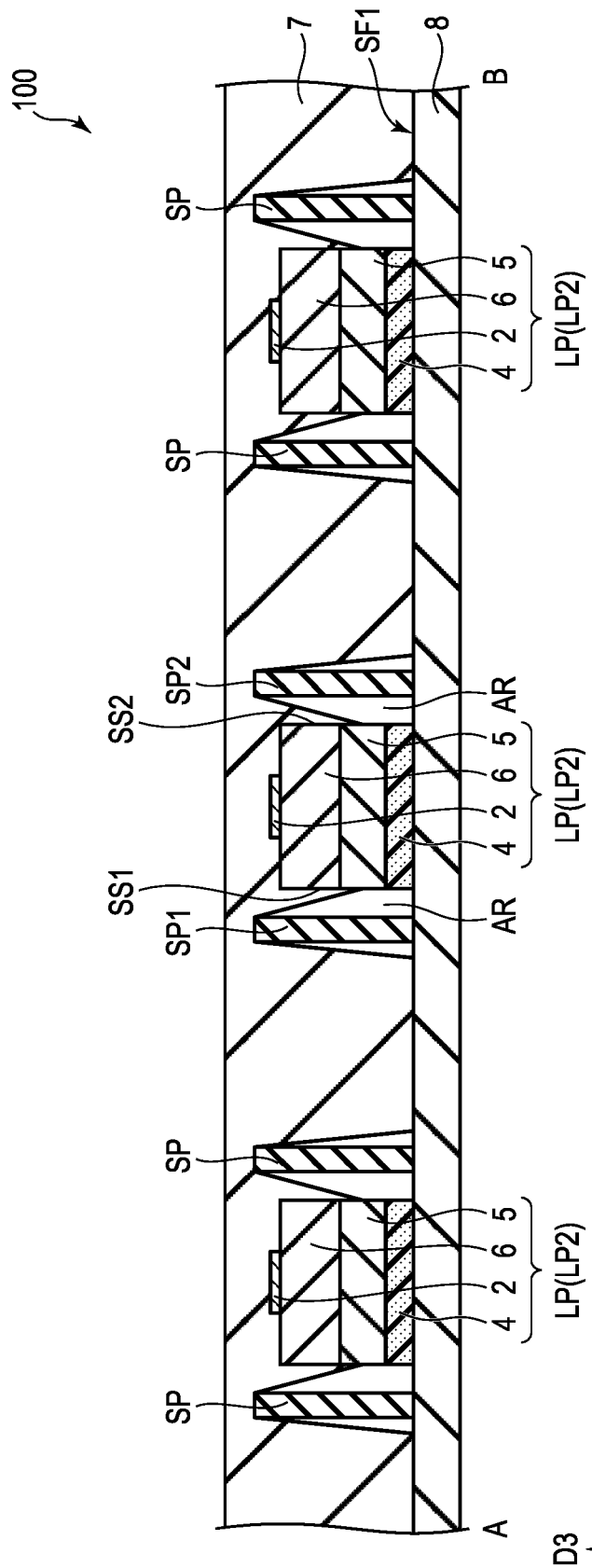
FIG. 7 is a cross-sectional view of the first modified example of this embodiment.

FIG. 7 is a cross-sectional view of a first modified example of this embodiment. The configuration shown in FIG. 7 is different from that of FIG. 3 in that the protective member 7 is disposed between the line portions LP and the spacers SP, respectively.

A part of the protective member 7 is formed adjacent to the air AR layers between the first spacers SP1 and the first side surfaces SS1, and between the second spacers SP2 and the second side surfaces SS2, respectively. The protective member 7 is formed by applying its material from above the spacers SP and the line portions LP. Therefore, the resin material of the protective member 7 may flow between the spacers SP and the line portions LP before it is cured. With the spacers SP thus provided, the protective material 7 attached to the first side surface SS1 and the second side surface SS2 can be thinned to such an extent that it does not contribute to the stress on the line portions LP.

In the first modified example with such a configuration, advantageous effect similar to those described above can be obtained.

Figure 8:
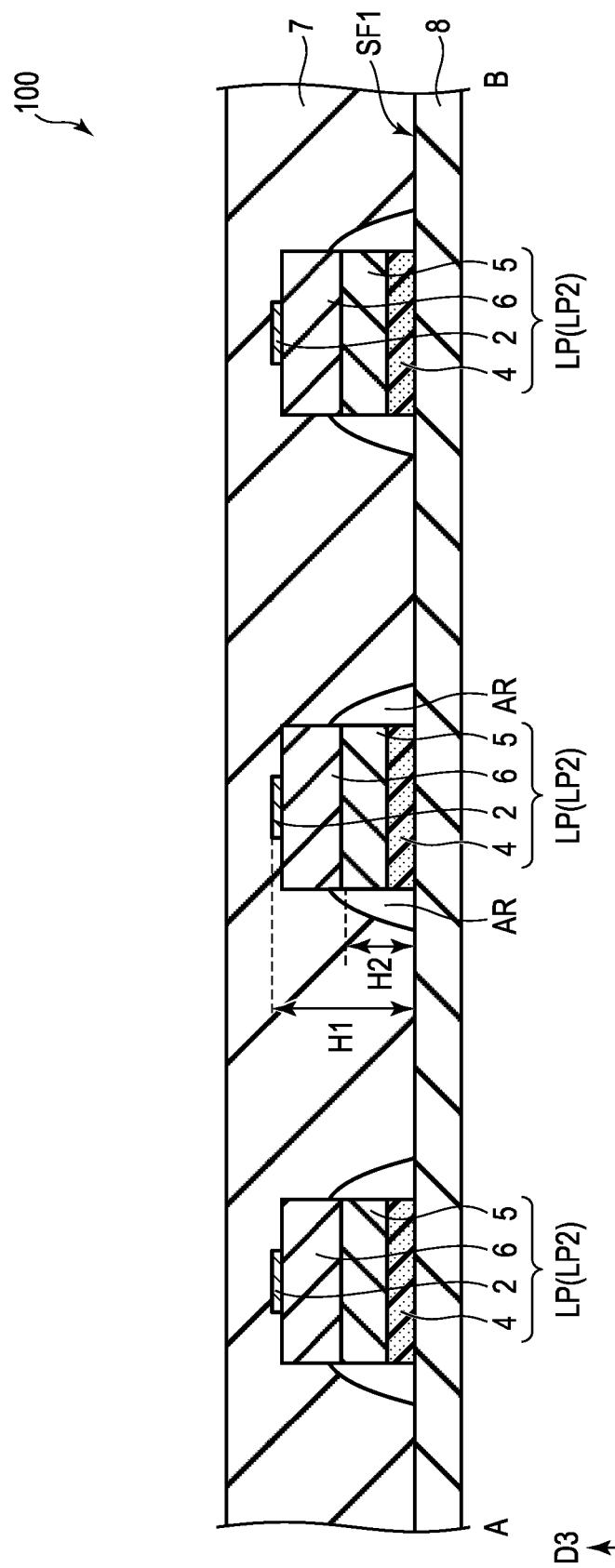
FIG. 8 is a cross-sectional view showing the second modified example of the embodiment.

FIG. 8 is a cross-sectional view of a second modified example of this embodiment. The configuration shown in FIG. 8 is different from that of FIG. 3 in that the spacers SP are not provided.

For example, by adjusting the viscosity of the resin used for the protective member 7, the air layers AR in contact with the first side surface SS1 and the second side surface SS2 are formed. Note that the air layers AR may be formed by some other method. Here, it is desirable that the first side surface SS1 and the second side surface SS2 be in contact with the air layers AR at least between the first surface SF1 and the position of the second height H2. In other words, the air layers AR have a thickness greater than the second height H2. In the example illustrated, the insulating base 4, the first organic insulating film 5, and the second organic insulating film 6 are in contact with the air layers AR.

In the second modified example with such a configuration, advantageous effects similar to those described above can be obtained.

As described above, according to this embodiment, it is possible to obtain a flexible substrate with an improved elongation rate, which can suppress the occurrence of cracks.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A flexible substrate comprising:
a support plate comprising a first surface;
a line portion located on the first surface and comprising a first side surface and a second side surface on an opposite side to the first side surface; and
a protective member which covers the line portion, in contact with the first surface, wherein
the line portion comprises a flexible insulating base located on the first surface and a wiring layer disposed on the insulating base,
the protective member is separated from at least a part of the first side surface via an air layer and from at least a part of the second side surface via an air layer, and
the air layers extending along the line portion.

2. The flexible substrate of claim 1, wherein
the insulating base is in contact with the air layers.

3. The flexible substrate of claim 1, wherein
the line portion include, in planar view, a plurality of wavy first line portions extending in a first direction and aligned along a second direction intersecting the first direction, a plurality of wavy second line portions extending in the second direction and aligned along the first direction, and island-shaped portions provided at respective intersections between the first line portions and the second line portions.

4. The flexible substrate of claim 1, wherein
the line portion has a first height, and
the first side surface and the second side surface are in contact with the respective air layers at least between the first surface and a location of a second height, which is half of the first height.

5. The flexible substrate of claim 4, further comprising:
a first spacer disposed on the first surface and opposing the first side surface; and
a second spacer disposed on the first surface and opposing the second side surface, wherein
the air layers are located respectively between the first spacer and the first side surface and between the second spacer and the second side surface.

6. The flexible substrate of claim 5, wherein
the first spacer and the second spacer have a third height, and
the third height is greater than the first height.

7. The flexible substrate of claim 5, wherein
a part of the protective member is formed adjacent to the air layers, respectively between the first spacer and the first side surface and between the second spacer and the second side surface.

8. The flexible substrate of claim 5, wherein
the first spacer and the second spacer each have a slit penetrating through to the support plate.

9. The flexible substrate of claim 5, wherein
the line portion includes a plurality of first line portions extending along a first direction and aligned along a second direction intersecting the first direction, a plurality of second line portions extending along the second direction and aligned along the first direction and openings each surrounded by each adjacent pair of first line portions and each adjacent pair of the second line portions, and the first spacer is located in the opening and is formed into a continuous loop along the first line portion and the second line portion.

\* \* \* \* \*